US005715064A

United States Patent [19]

Lin

[11] Patent Number: 5,715,064
[45] Date of Patent: Feb. 3, 1998

[54] STEP AND REPEAT APPARATUS HAVING ENHANCED ACCURACY AND INCREASED THROUGHPUT

[75] Inventor: Burn Jeng Lin, Tampa, Fla.

[73] Assignee: International Business Machines Corporation, Armonk, N.Y.

[21] Appl. No.: 261,630

[22] Filed: Jun. 17, 1994

[51] Int. Cl.⁶ .................................................. G01B 11/00
[52] U.S. Cl. ........................... 356/401; 356/375; 355/53
[58] Field of Search ...................... 356/345, 358, 356/400, 401, 375; 355/53, 55, 54

[56] References Cited

U.S. PATENT DOCUMENTS

| | | | |
|---|---|---|---|
| 4,597,664 | 7/1986 | Johannsmeier et al. | 355/43 |
| 4,648,708 | 3/1987 | Kosugi | 355/53 |
| 4,937,618 | 6/1990 | Ayata et al. | 355/43 |
| 5,114,234 | 5/1992 | Otsuka et al. | 356/358 |
| 5,117,255 | 5/1992 | Shiraishi et al. | 355/53 |
| 5,151,749 | 9/1992 | Tanimoto et al. | 356/358 |

FOREIGN PATENT DOCUMENTS

| | | |
|---|---|---|
| 57-183031 | 11/1982 | Japan . |
| 58-009133 | 1/1983 | Japan . |
| 2 155 201 | 9/1985 | United Kingdom . |

*Primary Examiner*—Frank Gonzalez
*Assistant Examiner*—Robert Kim
*Attorney, Agent, or Firm*—Susan M. Murray

[57] ABSTRACT

A multi-station Step and Repeat Apparatus (Stepper) for imaging semiconductor wafers. The stepper has at least 2 stations, at least one of which is for imaging. The second station may be used for image field characterization, or image defect correction, or for Phase Shift Mask (PSM) loop cutting. Multiple laser beams directed in orthogonal directions provide interferometric monitoring to track wafer locations for wafers on the stepper.

4 Claims, 7 Drawing Sheets

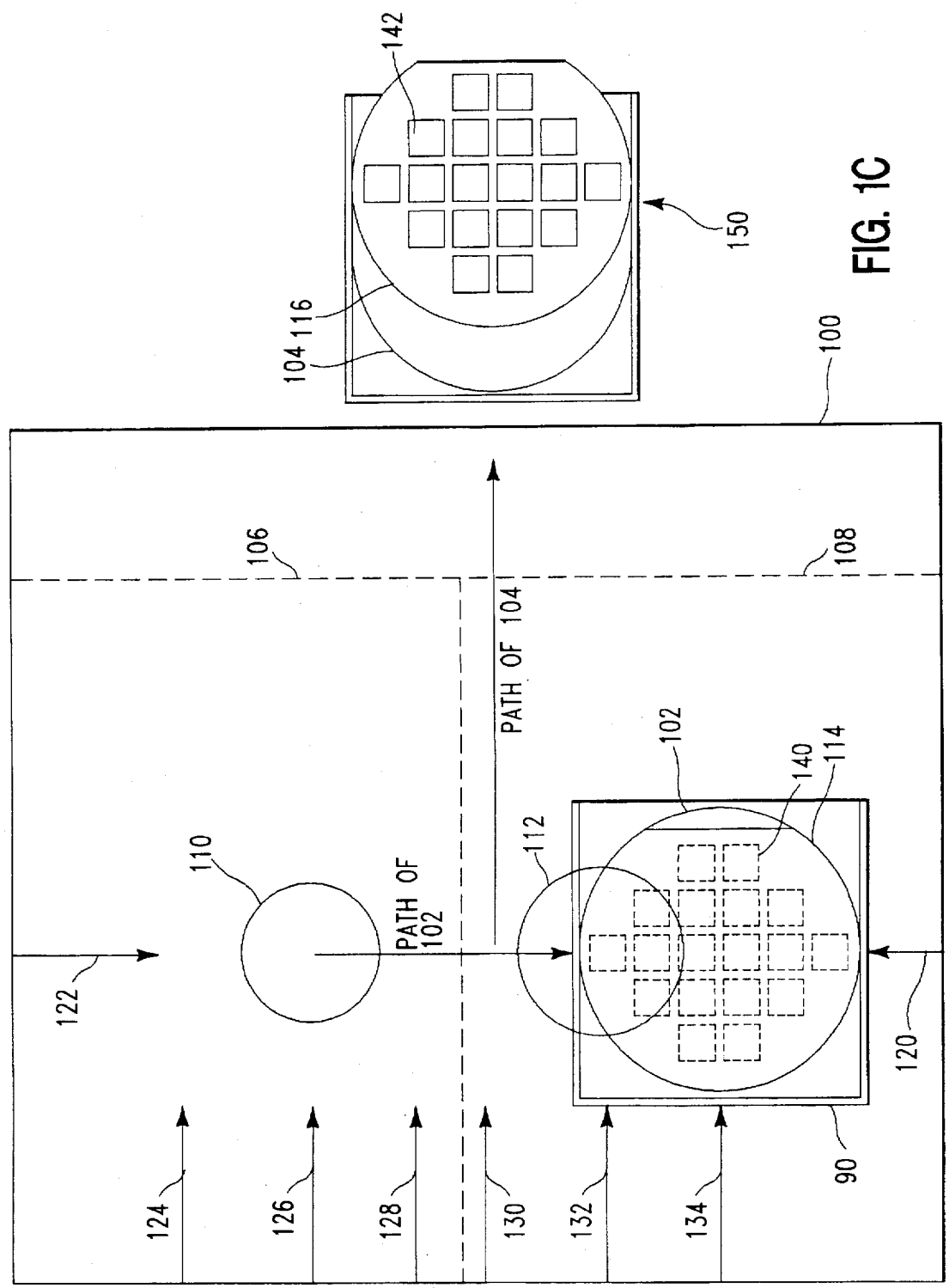

STEP AND REPEAT APPARATUS HAVING ENHANCED ACCURACY AND INCREASED THROUGHPUT

FIELD OF THE INVENTION

The present invention relates to a pattern transfer apparatus. More particularly, the present invention relates to a circuit pattern transfer apparatus used in semiconductor device manufacture.

BACKGROUND OF THE INVENTION

When integrated circuit chips are manufactured, typically, an array of identical chips is formed on one or more semiconductor wafers. Normally, each chip pattern is formed for each array chip by incrementally stepping the wafer in one horizontal direction, i.e., the x direction, or another, orthogonal direction, i.e., the y direction. At each incremental step, the chip pattern is printed in photoresist. The apparatus for sequentially stepping the wafer, and repeatedly printing the pattern at each step is called a stepper. The stepper includes: A platform called a chuck for mounting and for firmly holding the wafer; Some form of optical exposure apparatus (optics) for imprinting the pattern on the wafer; and, mechanical control for stepping the chuck through the array. The chuck has high mass compared to the wafer. The chuck also has some means of fixedly holding the wafer in place, such as pin hole sized orifices in the chuck through which a vacuum is applied to the back of the wafer. The chuck is usually movable, either manually, mechanically or electronically, under computer control. See, U.S. Pat. No. 4,648,708 to Kosugi entitled "Pattern Transfer Apparatus" for an example of a prior art stepper and incorporated herein by reference.

Stepper operation is relatively straight forward. The wafer is placed on and held by the chuck. Stepping and repeating the wafer is normally done under computer control. Normally, the wafer (on the chuck) is stepped. At each step, an adjacent chip field is positioned directly under the optics for printing the chip pattern. The optics must be able to focus on the full chip field in order to print a sharp chip image.

Previously, when integrated circuits were coarser and chips were relatively small, i.e., less than 10 mm on a side, the optical field of focus is sufficiently large to accommodate the variation of the distance between the wafer surface and the optics. There was little need to consider wafer surface planarity or incline. Steppers, with simple global focussing, were sufficient.

However, because of increasing demands for higher-function complex chips, chip features are becoming much finer and chip sizes are exceeding 10 mm. With finer features and larger chips, larger wafer irregularities become significant. Focusing across the full field has become increasingly difficult. So, a slight surface incline, which was negligible, may be too large to ignore for a larger field. Thus, focussing near one side of the field might put the opposite side out of focus. Alternatively, focussing near the middle of an inclined field might leave both sides unfocussed. So, to attain the correct focus across the full field, the wafer must be tilted to compensate for surface incline. Still, another problem is that adjacent fields may be slightly inclined to one another. Tilting the wafer to focus one field may leave adjacent fields out of focus.

Unfortunately, on prior art steppers, measuring each field's tilt impairs wafer throughput. A wafer must be measured on the stepper at many points for each field before printing an image in the field. All of these field measurements must be made without rechucking. Taking each of these field measurements, effectively increases stepper time required for each wafer. Alternatively, the number of required points per field can be reduced by characterizing the field incline for the entire wafer prior to imaging. However, to avoid rechucking, field incline characterization must be on the same stepper as imaging which still requires substantial stepper time.

After field incline characterization, the wafer cannot be unchucked and rechucked, because once the vacuum is interrupted by unchucking, the field incline data is corrupted. This data is corrupted because correlation of each field to the measurement, determined to an accuracy within tenths or hundredths of microns, cannot be maintained once the wafer has been removed, even when the wafer is repositioned on the same chuck. So, any method requiring unchucking of the wafer or removing the wafer from the stepper to measure the field incline separately is unacceptable. However, because it requires sequential steps, characterization prior to imaging, on the same chuck, doubles the time each wafer must be on the chuck and reduces stepper throughput.

Prior art steppers require a further tradeoff between wafer throughput and alignment accuracy. A typical alignment approach is to measure the wafer's registration mark position from off axis (away from under the imaging lens) at several locations. These position measurements are analyzed, statistically, for magnification, rotation, registration, and many other possible errors. Based on the analysis results, the wafer stage is positioned for best alignment and exposure. Just as with topography characterization, alignment measurements must be made without wafer rechucking prior to imaging. Consequently, to achieve the requisite alignment accuracy for high function, highly integrated chips, stepper throughput becomes unacceptably low.

Another problem arises from printing finer features. Phase Shift Masks (PSMs) provide an approach to achieving very high resolution for extremely fine features. However, PSMs require multiple mask exposures for the same image (e.g., for a process known as "loop cutting" or, for removing phase shifted lines). One image may require a high resolution imaging station and a second low-resolution station. So, printing these images require two stepper passes, the first with a high resolution mask and, the second, with a low resolution mask. If done on two steppers, these two pass PSM mask levels further reduce stepper throughput. Even more delay arises if both passes are done on the same stepper.

PURPOSES OF THE INVENTION

It is a purpose of the invention to improve stepper alignment accuracy.

It is another purpose of the invention to increase the usable depth of focus of a stepper.

It is yet another purpose of the invention to improve individual field focus on a multifield pattern printed in a stepper.

It is yet another purpose of the present invention to increase the usable depth of focus and alignment accuracy of a stepper.

It is still another purpose of the invention to improve stepper throughput in phase shift mask applications.

It is still another purpose of the invention to improve individual field focus on a multifield pattern printed on a stepper while improving stepper throughput.

It is yet another purpose of the present invention to increase stepper depth of focus and alignment accuracy while improving stepper throughput.

SUMMARY OF THE INVENTION

A step and repeat apparatus for forming a repeated image on a wafer, the stepper comprising at least two wafer stations and a lens at each said wafer station. The step and repeat apparatus may have two or more chucks. The two stations may be a characterization station for characterizing fields on a wafer, and, an imaging station for forming an image on the characterized fields.

BRIEF DESCRIPTION OF THE DRAWINGS

FIGS. 1A–1D are a representation of a first preferred embodiment multi-station stepper of the present invention.

TECHNICAL DESCRIPTION OF THE PREFERRED EMBODIMENT

The present invention is a step-and-repeat apparatus (stepper) with at least two wafer stations. As used hereinafter, station or wafer station refers to an area of the step-and-repeat apparatus wherein a specific, optical task is performed distinct from an optical task performed in another wafer station on the same apparatus. Thus, each station includes a chuck such as taught in U.S. Pat. No. 5,114,234 entitled "Stage Positioning Control Method and Apparatus" to Otsuka et al. and incorporated herein by reference, and includes optics required for the task to be performed on the wafer at that station.

Figure 1A:
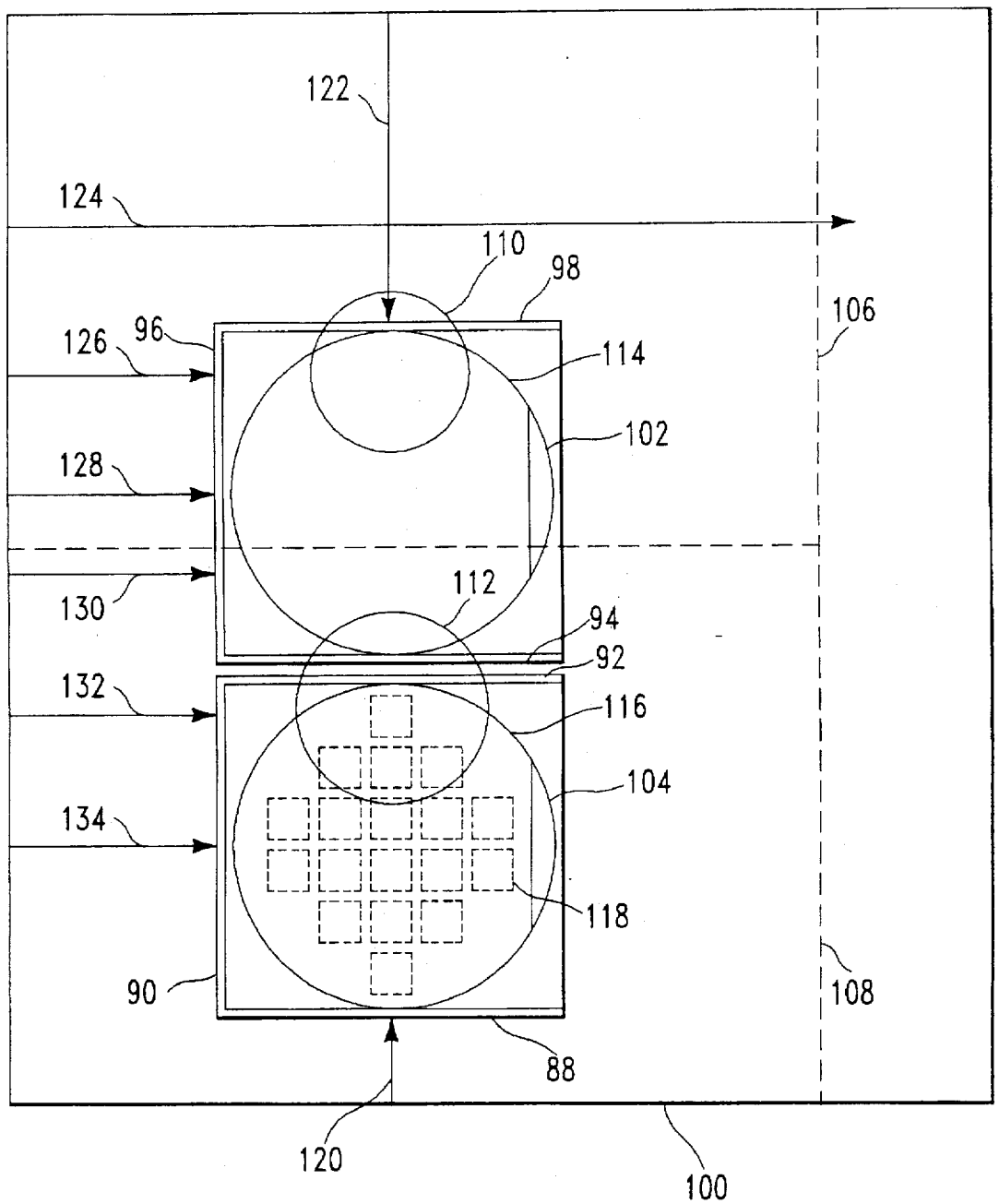

The first preferred embodiment, as represented in FIG. 1A, is a two station stepper. The stepper 100 includes a pair of chucks 102 and 104 and the two stations are a characterization station 106 and an imaging station 108, represented by the areas bounded by dotted lines. The latter station 108 has a imaging lens 112 and the former station 106 has a characterizing head 110. In addition, characterization station 106 which includes both chuck 102 and imaging lens 110 also includes instruments (not part of the present invention and no shown) for determining field incline and depth, for each field of wafer 114 and for determining any other required characteristics. After every wafer field is characterized in characterization station 106, the chuck 102 and wafer 114 are passed to imaging station 108. Imaging station 108 which includes chuck 104 and imaging lens 112, also includes instruments required for writing or printing (not part of the present invention and not shown) an image in each field of wafer 116. Simultaneous to characterizing wafer 114 in characterization station 106, an image is printed in each corresponding field of previously characterized wafer 116. Therefore, the characterization head 110 lens is selected for wafer characterization. Corresponding imaging lens 112 is chosen for providing a sharp, well-defined image. Optionally, the lens may be omitted from characterized head 110.

To double stepper throughput over prior art steppers, characterizing one wafer and imaging a second are simultaneous on the present invention. The chucks 102 and 104 operate in lockstep in coarse motion while allowing fine relative movements. While one wafer 114 is characterized in characterization station 106, a previously characterized wafer 116 is being imaged in imaging station 108. FIG. 1A represents the state of the present invention just prior to the start of this parallel operation. Wafer 114 is uncharacterized. Wafer 116 has fields 118 which were characterized in the characterization station 106, prior to imaging. A chuck controller (not part of the invention and not shown), typically a computer, keep both chucks 104, 106 in coarse lockstep with each other. The controller finetunes the exact spatial location and orientation of the chuck 104 for best image alignment, position and tilt, based on previously collected characterization data, data collected in the characterization station 106. Thus, because these operations can be done in parallel, stepper throughput is doubled over prior art steppers that only allowed serial characterization and imaging.

These parallel operations are possible for two reasons. First, each wafer remains fixed on the same chuck in both stations, characterization and imaging. Second, the chucks are interferometrically monitored constantly to track and maintain both wafer position and field position. Thus, the preferred embodiment stepper includes an apparatus for interferometrically monitoring the wafers on the chucks. Thus, multiple laser beams are directed at the wafers. Preferably, the laser beams are generated from a single energy source (not shown), that source generates a single beam (also not shown) which is split into multiple beams. Alternatively, multiple laser energy sources may be employed to generate the beams individually. The individual beams are directed toward the stations 106 and 108 to provide measurements for precise wafer monitoring and tracking. At least 3 laser beams are required to monitor and track both wafers' x-position, so as to ensure there is at least one laser beam tracking each wafer's x position, even when the wafer is travelling between the characterization station and the imaging station. In the preferred embodiment stepper, eight laser beams are positioned around the stations to monitor the wafer's orientation in addition to monitoring its location. In this preferred embodiment, two y-laser beams are directed along the stepper's y-axis (represented by arrows 120 and 122). Six x-laser beams are directed along the stepper's x-axis, (represented by arrows 124, 126, 128, 130, 132 and 134). Mirrors 88, 90, 92, 94, 96 and 98 are placed adjacent to the stations. The precise position of each wafer's fields must be found in the characterization station 106 and tracked in the imaging station 108 and at all times in between stations to guarantee accurate wafer tracking and alignment. This constant monitoring assures that characterization data collected in the characterization station 106 remains valid and accurate in the imaging station 108. Consequently, both wafers 114 and 116 must be continuously interferometrically monitored.

Figure 1B:
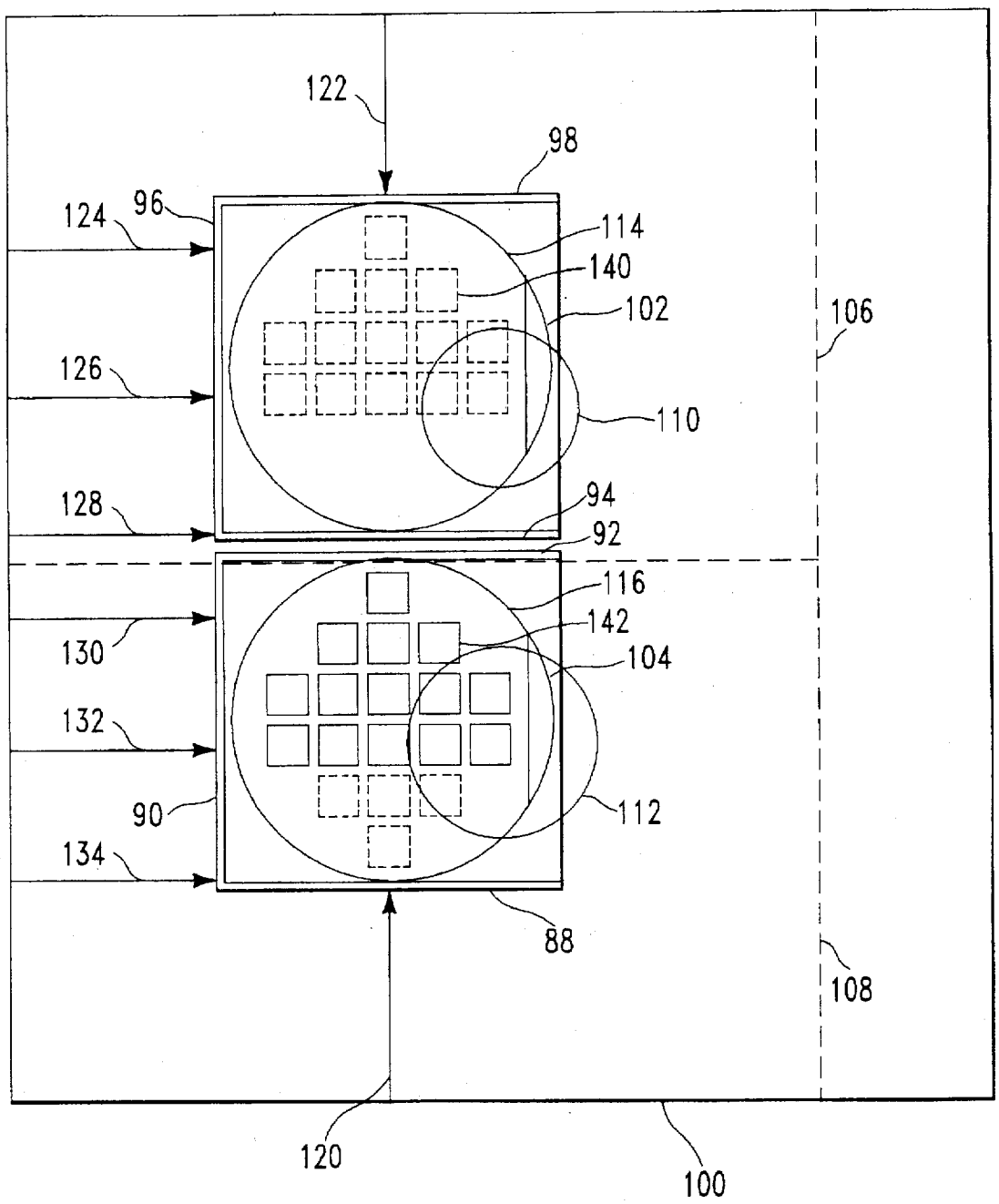

In FIG. 1B, the wafers 114 and 116 are partially characterized and imaged using the first preferred embodiment. Fields 140 have been characterized on characterization wafer 114 and, images have been written into corresponding fields 142 on the imaging wafer 116. After all of the characterization wafer fields 140 have been characterized, all of the imaging wafer fields have had images formed in them because the two chucks 102 and 104 step together as one in coarse motion.

After completing the parallel operations on the last pair of fields, as represented in FIG. 1C, the imaging chuck 104 with the completed wafer 116 (imaged wafer 116) is removed. Completed wafer 116 passes out of the imaging station 108 to load/unload position 150. At load/unload position 150, the imaged wafer 116 is removed for subsequent chemical/photo-processing. Simultaneously, former characterization chuck 102 with characterized wafer 114 moves into the imaging station 108 to become the imaging chuck 102.

Figure 1D:
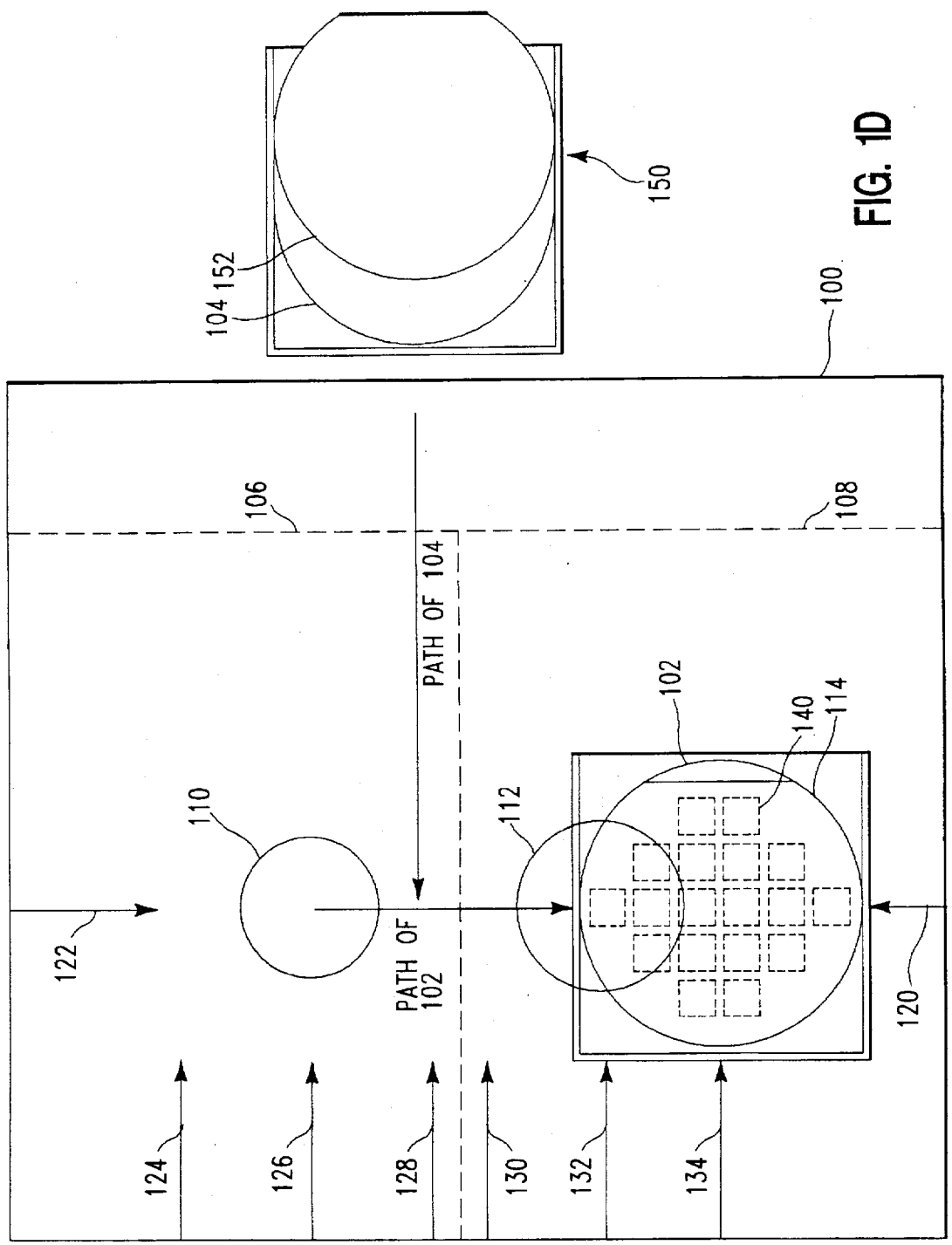

Finally, in FIG. 1D, a new (uncharacterized) wafer 152 is loaded onto chuck 104. Chucked wafer 152 on former imaging chuck 104 moves into the characterization station 106 to become the characterization chuck 104 and characterization wafer 152. This arrangement is identical to that of FIG. 1A. The parallel operations repeat as described above.

Figure 2A:
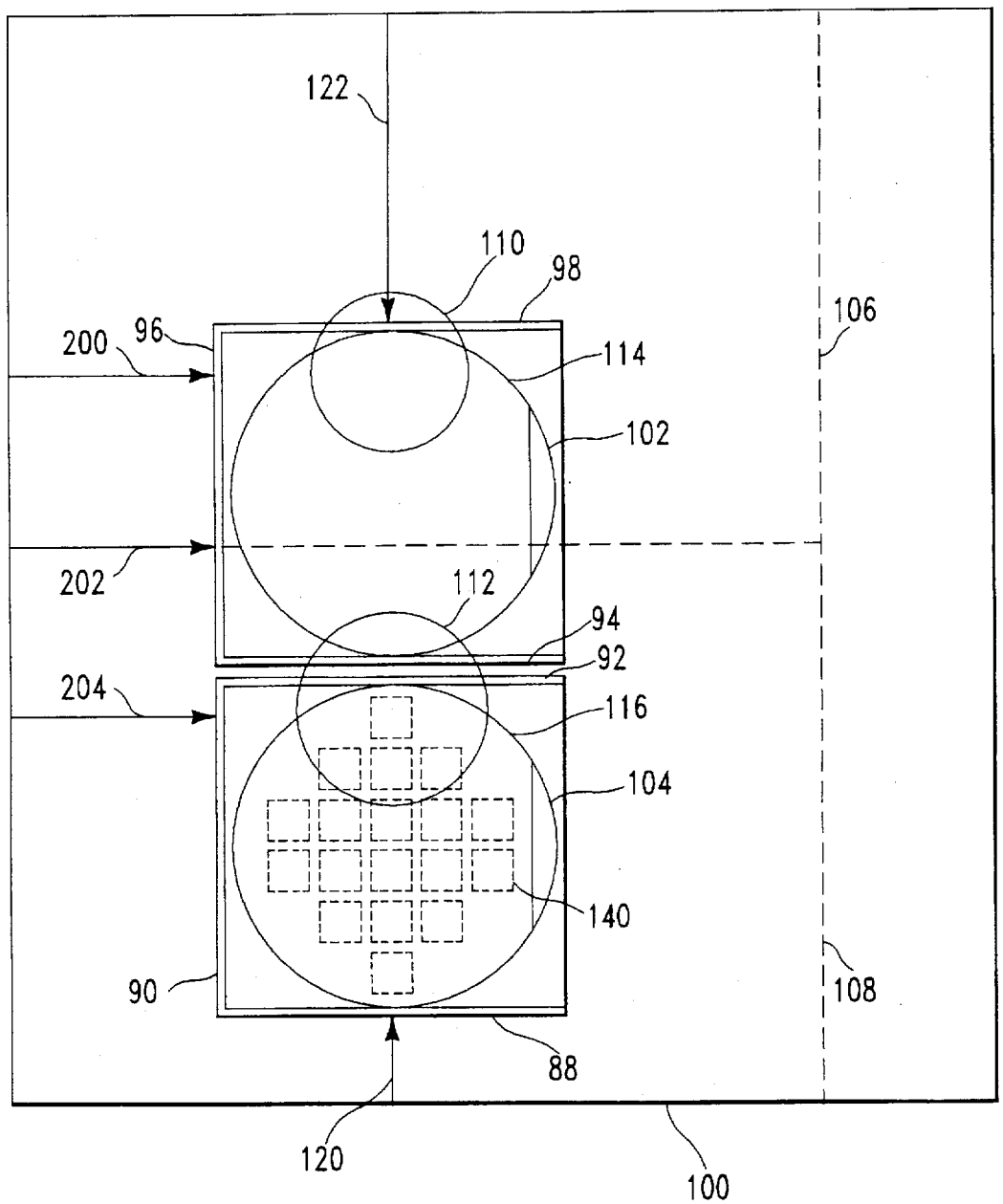
FIGS. 2A–2B are a representation of alternate embodiment two station stepper of the present invention.

As noted above, for interferometric monitoring, each wafer must be constantly monitored by at least 2 beams, one x and one y. Such a monitoring apparatus is shown in FIG. 2A. Two y-laser beams are represented by arrows 120 and 122 directed along the station's y-axis, and 3 x-laser beams are represented by arrows 200, 202 and 204 directed along the stepper's x-axis. In this embodiment, each wafer is constantly monitored by one y-laser-beam 120 or 122 and by at least one of the x-laser-beams 200, 202 or 204. Thus, each wafer's position is constantly monitored by at least 2 laser beams. While this embodiment provides accurate monitoring of field location, this minimum configuration does not accurately measure wafer rotation.

Figure 2B:
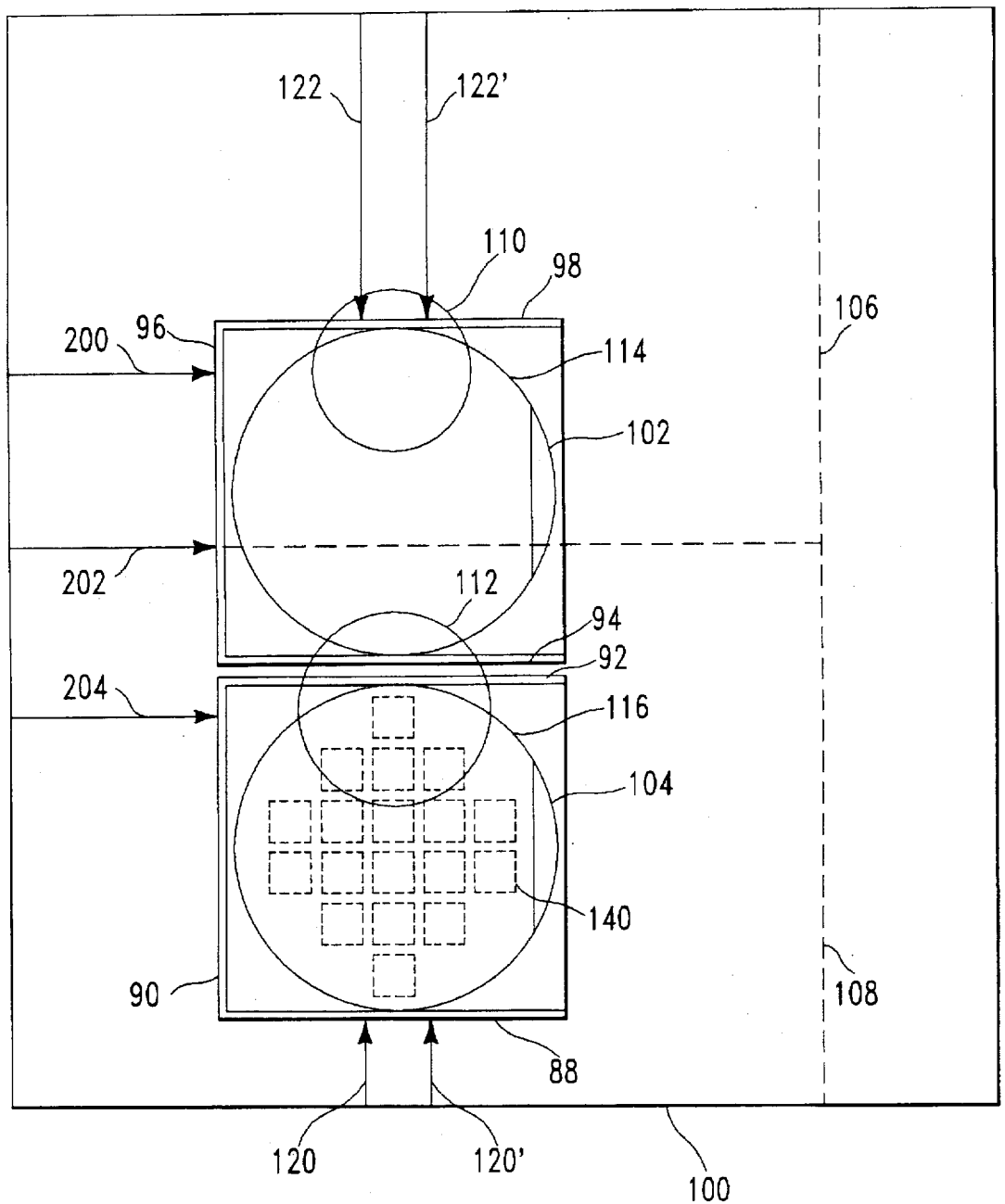

Monitoring wafer rotation, as well as location, requires that each wafer be monitored by at least 3 laser beams, at all times, such as provided in the embodiments of FIGS. 1A–D or FIG. 2B. The stepper of FIG. 2B is similar to that of 2A with 3 x-laser beams 200, 202 and 204. However, this alternate embodiment stepper of FIG. 2B has 2 additional y-laser beams 120' and 122', for a total of 7 laser beams. Each wafer is constantly monitored by at least one x-laser beam 200, 202 or 204 and by 2 y-laser beams 120 and 122 or 120' and 122'.

Figure 3:
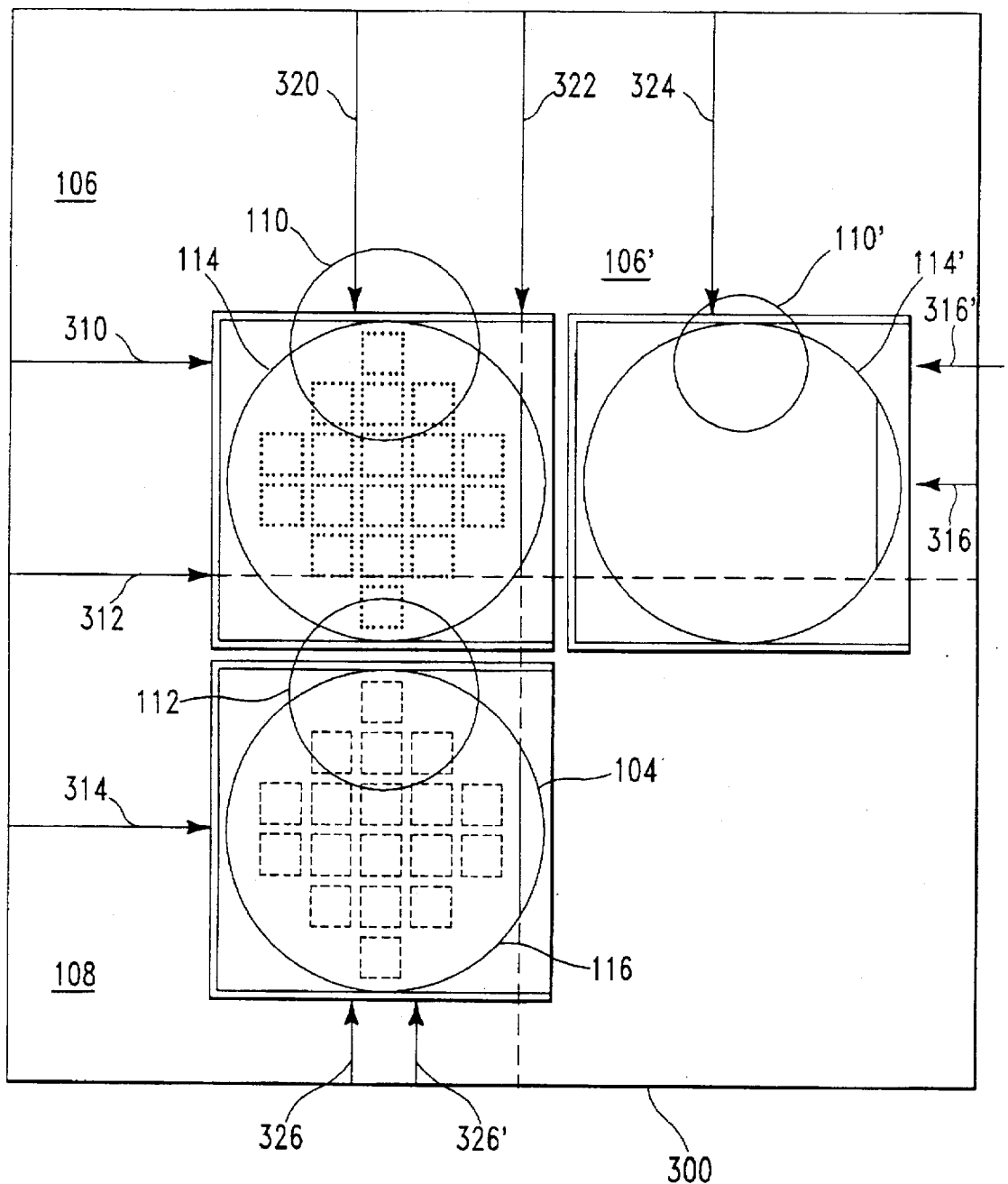
FIG. 3 is a representation of a preferred embodiment three station stepper of the present invention.

FIG. 3 is still another preferred embodiment stepper 300, wherein a third station is added to the first 2. This embodiment is especially suited to Phase Shift Mask (PSM) applications. The third station 106' has a high power secondary lens 110' such as required for providing orthogonal exposure, for PSM loop cutting, or for the exposure required for removing unwanted phase shift lines. Alternatively, the third station of stepper 106' could be used for repairing mask defects, or for improving image depth of focus. Image depth of focus can be improved by printing each field image a second time in this third station with an identical mask image at a slightly different focus. This embodiment of FIG. 3 has 4 x-laser beams 310, 312, 314 and 316 directed along the x-axis and 4 y-laser beams 320, 322, 324 and 326 directed along the y-axis. Optionally, laser beams 316' and 326' can be added to insure wafer rotation monitoring, similar to beams 120' and 122' of FIG. 2B. Operation of this 3 station stepper is substantially similar to that of the two station stepper of FIG. 1A.

Besides the alignment accuracy gained by interferometric monitoring, additional alignment accuracy improvement can be realized with the present invention without degrading throughput. Additional alignment accuracy can be realized by increasing the number of field registration points. Since mask registration accuracy is proportional to the square root of the number of registration points, increasing the number of registration points increases mask registration accuracy. Prior art steppers required extra time to locate wafer registration points. More registration points added more time (to locate the additional points). So, the number of wafer registration points is time limited for prior art steppers. With the present invention, registration points are detected, on the fly, as they are encountered during characterization. Locating registration points does not add time to characterization. Since no additional time is required, the number of registration points is unlimited. Furthermore, because of continuous interferometric monitoring with the present invention, once the registration points are located, that location is known and available in the imaging station 108.

So, for example, where a typical prior art, global wafer alignment system had 13 wafer registration points on a wafer, the same wafer, characterized and imaged on the preferred embodiment of FIG. 1A–D, could have 5 registration points per field. For a wafer with 50 fields, this translates to 250 registration points per wafer. Thus, the alignment accuracy improvement is:

$$\sqrt{250} / \sqrt{13} = 15.8/3.6$$

This improvement exceeds 400% improvement in alignment accuracy over the prior art. Again, critical to achieving this alignment improvement is continuous interferometric monitoring throughout both characterization and imaging, as provided by the present invention. Just as with field focus and tilt, this alignment improvement is lost if interferometric monitoring is interrupted because, either the controller loses track of the wafer between stations or, from unchucking and chucking the wafer between stations.

While the present invention is described in terms of preferred embodiments, numerous modifications and variations will occur to a person of ordinary skill in the art. It is intended that those variations and modifications fall within the appended claims.

I claim:

1. A step and repeat apparatus for forming a repeated image on a wafer, the step and repeat apparatus comprising:
   a first wafer station comprising a first wafer chuck and a first optical apparatus, the first wafer chuck for holding a first wafer, the first wafer station for performing a first optical task on the first wafer;
   a second wafer station comprising a second wafer chuck and a second optical apparatus, the second wafer chuck for holding a second wafer, the second wafer station for performing a second optical task on a second wafer simultaneously while the first wafer station performs the first optical task on the first wafer, the second wafer having previously had the first optical task performed on the second wafer by the first optical station;
   movement means for moving the second wafer chuck to an unloading/loading position at which position the second wafer is unloaded from the second wafer chuck and a third wafer is loaded onto the second wafer chuck, for moving the first wafer chuck to the second wafer station without disturbing the first wafer and for moving the second wafer chuck from the unloading/loading position to the first wafer station; and
   a wafer location monitoring apparatus coupled with the movement means, the wafer location monitoring apparatus for constantly monitoring the positions of the first and second wafer chucks wherein the wafer location monitoring apparatus locates and monitors the first and second wafer chucks interferometrically, wherein each of the first wafer station and second wafer station is positioned along a first axis, the first axis defining a work path along which the first chuck is moved between the first and second stations; and wherein the wafer location monitoring apparatus comprises: a source of at least five laser beams, a first of the at least five laser beams positioned around the first station and directed along or parallel the first axis towards the first chuck, a second of the at least five laser beams positioned around the second station directed along or parallel the first axis towards the second chuck, a third of the at least five laser beams positioned around the first station and directed along or parallel a second axis towards the first chuck, the second axis being perpendicular the first axis, a fourth of the at least five laser beams positioned around the second station and directed along or parallel the second axis towards the second chuck, a fifth of the at least five laser beams positioned intermediate the first and second stations and directed along or parallel the second axis towards the work path; a first and a second plurality of at least three mirrors disposed about each of the respective first and second wafer chucks, first and second mirrors of the respective first and second pluralities positioned perpendicular the first axis for respectively reflecting the first laser beam, third and fourth mirrors of the respective first and second pluralities positioned perpendicular the first axis for respectively reflecting the second laser beam, fifth and sixth mirrors of the respective first and second pluralities positioned parallel the first axis for reflecting the third, fourth and fifth laser beams; wherein the position of each of the first and second wafers is constantly monitored by at least one of the first and second laser beams and at least one of the third, fourth and fifth laser beams.

2. The step and repeat apparatus of claim 1 wherein the first wafer station comprises a characterization station for characterizing fields on a wafer and wherein the second wafer station comprises an imaging station for forming an image on the characterized fields.

3. The step and repeat apparatus of claim 2 wherein said characterization station includes means for determining field depth and field incline.

4. The step and repeat apparatus of claim 2 wherein said characterization station includes means for detecting registration points.

* * * * *